United States Patent
Chaintreuil et al.

(10) Patent No.: US 10,910,992 B2
(45) Date of Patent: Feb. 2, 2021

(54) METHOD AND DEVICE FOR DETECTING A STRAY ELECTRIC ARC IN A PHOTOVOLTAIC INSTALLATION

(71) Applicant: COMMISSARIAT A L'ENERGIE ATOMIQUE ET AUX ENERGIES ALTERNATIVES, Paris (FR)

(72) Inventors: Nicolas Chaintreuil, Montmelian (FR); Stéphane Siat, Obenheim (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 365 days.

(21) Appl. No.: 15/780,115

(22) PCT Filed: Dec. 1, 2016

(86) PCT No.: PCT/EP2016/079467
§ 371 (c)(1),
(2) Date: May 30, 2018

(87) PCT Pub. No.: WO2017/093421
PCT Pub. Date: Jun. 8, 2017

(65) Prior Publication Data
US 2018/0375466 A1  Dec. 27, 2018

(30) Foreign Application Priority Data
Dec. 1, 2015 (FR) ................. 15 61626

(51) Int. Cl.
*H02H 1/00* (2006.01)
*H02H 7/20* (2006.01)
(Continued)

(52) U.S. Cl.
CPC .......... *H02S 50/00* (2013.01); *H02H 1/0015* (2013.01); *H02H 1/0092* (2013.01); *H02H 7/20* (2013.01);
(Continued)

(58) Field of Classification Search
CPC ...... H02H 1/00; H02H 1/0007; H02H 1/0015; H02H 1/0023; H02H 1/0092; H02H 7/20;
(Continued)

(56) References Cited

U.S. PATENT DOCUMENTS

| | | | |
|---|---|---|---|
| 2005/0286184 A1* | 12/2005 | Campolo | H02H 1/0015 361/42 |
| 2011/0267721 A1* | 11/2011 | Chaintreuil | G01R 31/28 361/2 |

(Continued)

FOREIGN PATENT DOCUMENTS

| | | |
|---|---|---|
| FR | 3 002 645 A1 | 8/2014 |
| FR | 3 044 487 A1 | 6/2017 |

OTHER PUBLICATIONS

Koziy et al., "A Low-Cost Power-Quality Meter With Series Arc-Fault Detection Capability for Smart Grid", XP11515987, IEEE Transactions on Power Delivery, vol. 28, No. 3, Jul. 2013, pp. 1584-1589; cited in the ISR (in English).
(Continued)

*Primary Examiner* — Thienvu V Tran
*Assistant Examiner* — Ivan Laboy
(74) *Attorney, Agent, or Firm* — Westerman, Hattori, Daniels & Adrian, LLP

(57) ABSTRACT

A photovoltaic installation comprising at least one photovoltaic module (1) and an electromechanical unit capable of producing a non-stray electric arc of a duration less than or equal to a given arc-quenching duration (x) when contacts of the electromechanical unit are opened. The photovoltaic
(Continued)

Legend:
2 = inverter
4 = electrical grid
6 = stray electric arc detection device
15 = intervention device installation comprising a method comprising the steps of: detecting (E0) the appearance of an electric arc in a photovoltaic installation; triggering (E1) a timer to start timing from the moment (T0) of appearance of an electric arc; measuring (E3) at least one of electric quantities of a group including a voltage ($V_m$) of the at least one photovoltaic module and a current (I) produced by the photovoltaic installation at the end of the arc-quenching duration starting from the moment (T0) of appearance of the electric arc; comparative testing (E4; E5) in order to determine whether the measured electric quantity is equal to an open-circuit voltage ($V_{OC}$) of the photovoltaic module or to a zero current; and, if the test is negative, identifying a stray electric arc.

20 Claims, 6 Drawing Sheets

(51) Int. Cl.
   *H02H 7/26* (2006.01)
   *H02S 50/00* (2014.01)
   *H02S 50/10* (2014.01)
   *G01R 31/40* (2020.01)
   *G01R 19/165* (2006.01)

(52) U.S. Cl.
   CPC .. *G01R 19/16571* (2013.01); *G01R 19/16576* (2013.01); *G01R 31/40* (2013.01); *H02S 50/10* (2014.12)

(58) Field of Classification Search
   CPC .......... H02H 7/26; H02S 50/00; H02S 50/10; H02S 50/15; H01L 31/02; H01L 31/02002; H01L 31/02008; H01L 31/02021; G01R 19/165; G01R 19/16528; G01R 19/16566; G01R 19/16571; G01R 19/16576; G01R 19/1659; G01R 19/175; G01R 31/40; G01R 31/50; G01R 31/52; G01R 31/54; G01R 31/55; G01R 31/58; G01R 31/66; G01R 31/67; G01R 31/68; G01R 31/69; G01R 31/70
   USPC ..................................... 361/86–87
   See application file for complete search history.

(56) References Cited

U.S. PATENT DOCUMENTS

| | | | | |
|---|---|---|---|---|
| 2012/0134058 | A1* | 5/2012 | Pamer | G01R 31/1227 361/42 |
| 2013/0335861 | A1* | 12/2013 | Laschinski | H02H 1/0015 361/2 |
| 2014/0119072 | A1* | 5/2014 | Behrends | G01R 31/40 363/55 |
| 2014/0168843 | A1* | 6/2014 | Privitera | G01R 31/50 361/93.1 |
| 2014/0301008 | A1* | 10/2014 | Gouy-Pailler | H01L 31/02021 361/93.2 |
| 2014/0373894 | A1* | 12/2014 | Stratakos | H02H 1/0015 136/244 |
| 2015/0357972 | A1 | 12/2015 | Lespinats et al. | |
| 2015/0381111 | A1* | 12/2015 | Nicolescu | H02H 1/0015 361/3 |
| 2016/0003883 | A1* | 1/2016 | Chaintreuil | H02S 50/10 361/42 |
| 2016/0181799 | A1* | 6/2016 | Kanemaru | H02S 50/00 307/78 |
| 2016/0282398 | A1* | 9/2016 | Zhu | G01R 31/1227 |
| 2017/0170782 | A1* | 6/2017 | Yoscovich | H02H 1/0015 |
| 2017/0343596 | A1* | 11/2017 | Misumi | G01R 31/1272 |
| 2018/0097354 | A1* | 4/2018 | Yoscovich | H02J 3/383 |
| 2018/0233901 | A1* | 8/2018 | Ashida | H02S 50/00 |
| 2018/0358797 | A1* | 12/2018 | Chaintreuil | H02H 1/0092 |
| 2018/0375319 | A1* | 12/2018 | Chaintreuil | H02S 50/00 |
| 2018/0375467 | A1* | 12/2018 | Chaintreuil | H02H 7/20 |
| 2019/0120894 | A1* | 4/2019 | Han | G01R 19/0092 |

OTHER PUBLICATIONS

Schimpf et al., "Recognition of Electric Arcing in the DC-wiring of Photovoltaic Systems", XP31579534, Intelec 09: 31st International Telecommunications Energy Conference; Incheon, Korea, Oct. 18-22, 2009, IEEE, Piscataway, NJ, Oct. 18, 2009, 6 pages; cited in the ISR (in English).

International Search Report and Written Opinion dated Jan. 16, 2017 issued in corresponding application No. PCT/EP2016/079467; w/ English partial translation and partial machine translation (17 pages).

* cited by examiner

Legend:

2 = inverter
4 = electrical grid
6 = stray electric arc detection device
15 = intervention device Arc duration Legend:

6 = stray electric arc detection device
7 = detection module
8 = timer
9 = sensor(s)
10 = sensor(s)
11 = control module
12 = test module
13 = module for identifying
14 = processing unit
15 = intervention device
17 = communication link

METHOD AND DEVICE FOR DETECTING A STRAY ELECTRIC ARC IN A PHOTOVOLTAIC INSTALLATION

TECHNICAL FIELD OF THE INVENTION

The invention relates to a method and a device for detecting a stray electric arc in a photovoltaic installation. It also relates to a photovoltaic installation equipped with such a device.

PRIOR ART

Photovoltaic installations have the feature of operating with DC electric current and voltage. This proves problematic in the event of the appearance of an electric arc, which may occur in faulty conductors or connections (for example following the opening of a live connector or on account of corrosion of a conductor). With DC current and voltage, there is no natural quenching of the electric arc through a zero-crossing of the voltage and of the current, as is the case with AC current. The result of this is that the electric arc that occurs within a photovoltaic installation is liable to generate a plasma that releases a very large amount of heat for a significant duration. Such a plasma is destructive and may start a fire. For safety reasons, it is therefore essential to detect the presence of a possible electric arc within a photovoltaic installation and to interrupt it in good time in order to prevent any damage or starting of a fire. To this end, the photovoltaic installation is equipped with an arc detection device, or arc detector. The latter is generally associated with an intervention or arc-quenching device that is intended to intervene so as to interrupt the electric arc and prevent any damage or starting of a fire.

An electric arc is formed by a plasma that appears between two electrodes. Said electrodes may be formed by the two ends of a conductor or by two parts of a connector that is open or locally interrupted (on account of corrosion for example). The appearance of an electric arc is accompanied by a positive voltage jump or edge of short duration, of the order of a few microseconds. This voltage jump, called arc voltage $V_{arc}$, has a value that is characteristic of an electric arc. The arc voltage depends on the material of the electrodes. It is generally between 10 V and 30 V. If the electrodes are made of copper for example, the arc voltage $V_{arc}$ is of the order of 12 V. Thus, a sharp increase, of between 10 V and 30 V, in a voltage measured within a photovoltaic installation more often than not indicates the appearance of an electric arc in the installation. With the plasma of the electric arc performing the role of a resistance that increases over time, the initial voltage edge is generally followed by a gradual increase in the measured voltage until it reaches an open circuit voltage.

There are numerous methods for detecting an electric arc in a photovoltaic installation. One known method is based on the detection of a positive voltage edge or jump characterized by a sharp voltage increase of a duration of a few microseconds and with a value corresponding to the arc voltage $V_{arc}$, typically between 10 V and 30 V. To this end, the voltage across the terminals of one or more photovoltaic modules of the installation is measured, for example.

The electric arc is a physical phenomenon that may also occur, during normal operation, in an electromagnetic control and/or protection unit, upon opening or upon closure of contacts or poles. For example, upon opening, a disconnecting switch generates an electric arc of a duration less than or equal to a known maximum duration. Arc-quenching means may make it possible to interrupt the arc so that it does not last beyond a predefined maximum arc duration X. Typically, the maximum arc duration X of a disconnecting switch is of the order of a few hundred milliseconds for a current of several amperes, for example 800 ms for a current of 14 A. Generally, an electric arc having a duration less than or equal to this arc duration X does not pose a risk of starting a fire in the area in which the arc occurs.

A photovoltaic installation may incorporate one or more disconnecting switches. Upon opening, these generate an electric arc that is extinguished or quenched by arc-quenching means, at the latest upon expiry of a predefined arc-quenching duration. However, such an electric arc may be detected by the arc detection device of the photovoltaic installation, if said device has a very fast reaction time, and trigger an arc detection that leads to unwanted complete or partial shutdown of the photovoltaic installation.

In order to ensure correct operation of the photovoltaic installation and prevent any unwanted shutdown thereof upon opening of a disconnecting switch, the arc detection device should not trigger in the event of the appearance of an electric arc linked to normal operation of the disconnecting switch.

Subject of the Invention

To this end, the invention relates to a method for detecting a stray electric arc in a photovoltaic installation including at least one photovoltaic module and an electromechanical unit liable to generate a non-stray electric arc of a duration less than or equal to a given arc-quenching duration, upon opening of contacts of said unit, characterized in that it comprises the following steps:

Detecting the appearance of an electric arc in the photovoltaic installation;

Triggering a timer starting from an instant of appearance of the electric arc;

After expiry of the arc-quenching duration starting from the instant of appearance of the arc, measuring at least one of the electrical values from the group including a voltage of said at least one photovoltaic module and a current produced by the installation;

A comparison test in order to determine whether the measured electrical value is equal to an open circuit voltage of the photovoltaic module or to a zero current;

If the test is negative, identifying a stray electric arc.

The term 'stray' is understood to denote an electric arc that is not linked to normal operation of the electromechanical unit and that is generally linked to a fault.

The invention makes it possible to differentiate between an electric arc generated by the opening of contacts of an electromechanical unit of the photovoltaic installation when live, which is not stray, and a stray electric arc that is linked to a fault. This avoids triggering a positive electric arc detection if the detected electric arc is linked to the opening of the electromechanical unit, during normal operation.

Advantageously, in the measurement step, upon expiry of the arc-quenching duration, the voltage of said at least one photovoltaic module and the current produced by the installation are measured, the method comprises a first comparison test in order to determine whether the measured voltage is equal to the open circuit voltage of the photovoltaic module and a second comparison test in order to determine whether the measured current is zero, and it is determined that the detected electric arc is a stray arc if at least one of the two tests is negative. The identification of a stray (or non-stray) electric arc is thus even more reliable.

In a first embodiment, the appearance of an electric arc is detected by executing an algorithm for detecting a voltage jump characteristic of the appearance of an electric arc.

In a second embodiment, the appearance of an electric arc is detected by executing an algorithm for detecting a current jump characteristic of the appearance of an electric arc.

The invention also relates to a device for detecting a stray electric arc, intended to be fitted in a photovoltaic installation including at least one photovoltaic module and an electromechanical unit intended to generate a non-stray electric arc of a duration less than or equal to a given arc-quenching duration, upon opening of contacts of said unit when live, characterized in that it comprises:

a module for detecting the appearance of an electric arc in the photovoltaic installation;

a timer intended to time a lapsed duration starting from the instant of appearance of the electric arc;

a sensor for measuring at least one of the electrical values from the group including a voltage across the terminals of the photovoltaic module and a current produced by the installation, intended to perform a measurement after expiry of the arc-quenching duration starting from the instant of appearance of the arc;

a test module intended to carry out a comparison test in order to determine whether the measured electrical value is equal to an open circuit voltage of the photovoltaic module or to a zero current;

a module for identifying the detected electric arc, intended to determine that the detected electric arc is a stray arc if the test module supplies a negative test result.

Advantageously, the device comprises at least one sensor for measuring the voltage of said at least one photovoltaic module and a sensor for measuring the current produced by the installation, the test module is intended to carry out a test of comparing the measured voltage with the open circuit voltage of the photovoltaic module and a test of comparing the measured current with a zero current, and the module for identifying the detected electric arc is intended to determine that the detected electric arc is a stray arc if the test module supplies a negative test result for at least one of the two comparison tests that are carried out.

In a first form of implementation, the device comprises a module for detecting the appearance of an electric arc by executing an algorithm for detecting a voltage jump characteristic of the appearance of an electric arc.

In a second form of implementation, the device comprises a module for detecting the appearance of an electric arc by executing an algorithm for detecting a current jump characteristic of the appearance of an electric arc.

The invention also relates to a photovoltaic installation, characterized in that it comprises a stray electric arc detection device.

The invention also relates to a safety system for a photovoltaic installation, characterized in that it comprises a device for detecting a stray electric arc such as defined above and an intervention device intended to protect the photovoltaic installation in the event of an electric arc.

The invention relates lastly to a photovoltaic installation, characterized in that it comprises a safety system such as defined above.

BRIEF DESCRIPTION OF THE DRAWINGS

The invention will be better understood with the aid of the following description of a particular embodiment of the method for detecting a stray electric arc and of a particular form of implementation of a device for detecting a stray electric arc, of a safety system for a photovoltaic installation and of a photovoltaic installation, according to the invention, with reference to the appended drawings, in which.

DETAILED DESCRIPTION OF PARTICULAR EMBODIMENTS OF THE INVENTION

The invention aims to trigger a positive electric arc detection within a photovoltaic installation 100 only if the electric arc is a stray arc, that is to say is linked to a fault (for example a conductor fault or a connection fault). By contrast, a 'non-stray' electric arc is linked to normal, non-faulty operation of the photovoltaic installation 100, and does not pose a safety risk a priori. A non-stray electric arc may occur upon opening of contacts of an electromechanical unit when live (that is to say while a non-zero electric current is flowing), for example of a disconnecting switch.

Figure 1:
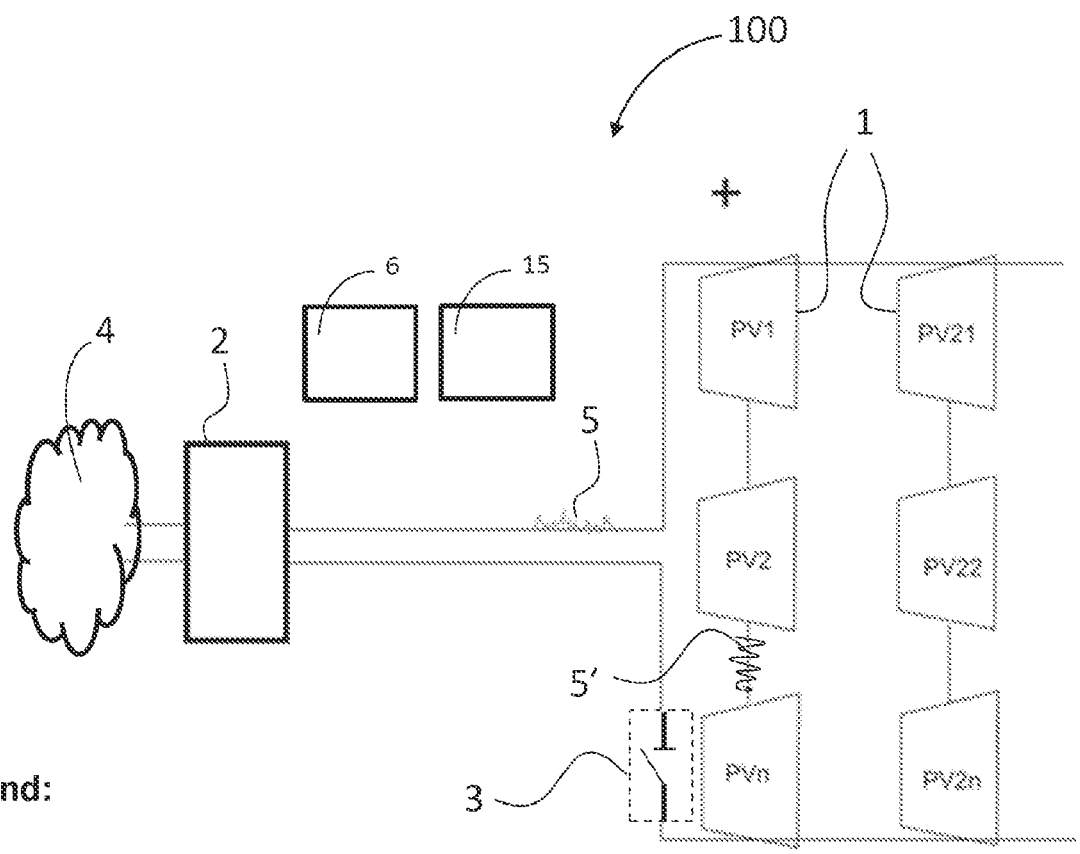
FIG. 1 shows a diagram of a photovoltaic installation according to one exemplary embodiment of the invention.

FIG. 1 schematically shows an example of a photovoltaic installation 100. Said installation comprises, in a known manner, a plurality of photovoltaic (PV) modules 1 linked to an inverter 2 and a disconnecting switch 3. The PV modules 1 are identical in this case. The inverter 2 is intended to convert the DC current I produced by the photovoltaic modules 1 into an AC current, and to supply this to an electrical grid 4. The role of the disconnecting switch 3 is to interrupt the current and electrically isolate the parts upstream and downstream thereof for maintenance operations, for example.

The method of the invention looks to detect the presence, or lack thereof, of a stray electric arc, linked to a fault, within a photovoltaic installation 100, while avoiding detecting the presence of a non-stray electric arc. A stray electric arc may occur at any location in the installation 100, for example between the photovoltaic modules 1 and the inverter 2 (as shown by the electric arc 5 in FIG. 1), or within a photovoltaic module 1, or else on a link linking a plurality of photovoltaic modules 1 in series (as shown by the electric arc 5' in FIG. 1). A non-stray electric arc may occur during normal operation of the installation 100, in this case within the disconnecting switch 3, upon opening of the contacts thereof when live.

An electric arc causes a significant variation in the voltage within the electrical installation 100. The appearance of the electric arc is characterized by a positive voltage jump or edge, of a duration of the order of a few microseconds and with a magnitude equal to a characteristic initial arc voltage $V_{arc0}$. The value of this initial arc voltage $V_{arc0}$ is typically of the order of 20 V, generally between 10 V and 30 V. It depends on the material of the electrodes between which the electric arc forms. When an electric arc appears in the photovoltaic installation 100, be it an electric arc linked to a fault (for example the arc 5 or 5') or an electric arc linked to the opening of the disconnecting switch 3 when live, the voltage across the terminals of each photovoltaic module 1 increases sharply by the initial arc voltage $V_{arc0}$ and the current I produced by the photovoltaic installation also drops sharply by a value $I_{arc}$. This value $I_{arc}$ depends on the position of the operating point on the current-voltage curve, or I-V characteristic curve, of the photovoltaic module and on its level of illuminance.

Figure 2:
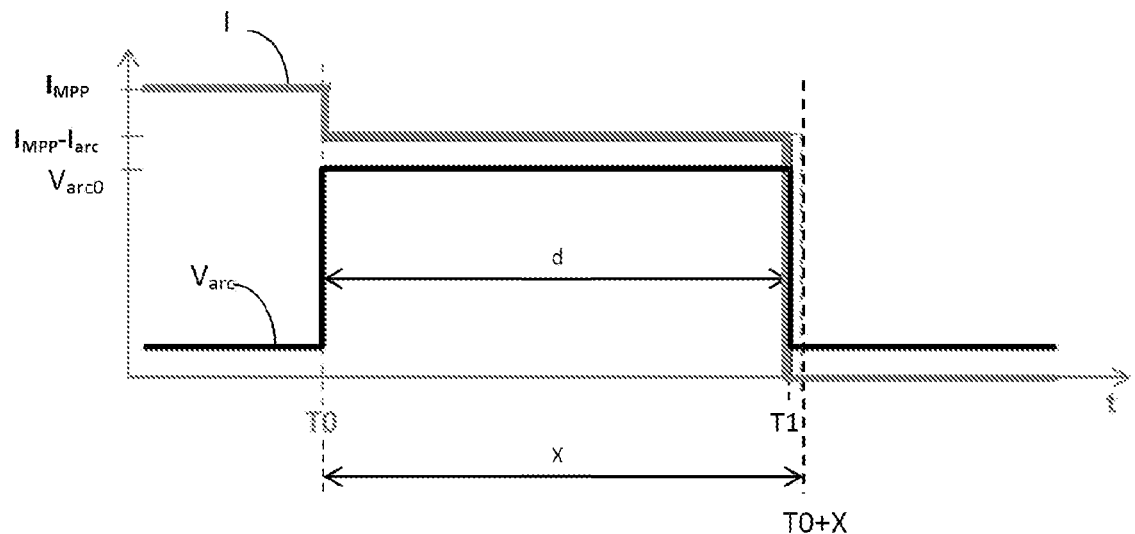
FIG. 2 shows the schematic temporal evolution of the voltage across the terminals of an electric arc generated upon opening of an electromagnetic unit and the concomitant schematic temporal evolution of the current produced by the photovoltaic installation of FIG. 1.
Figure 3:
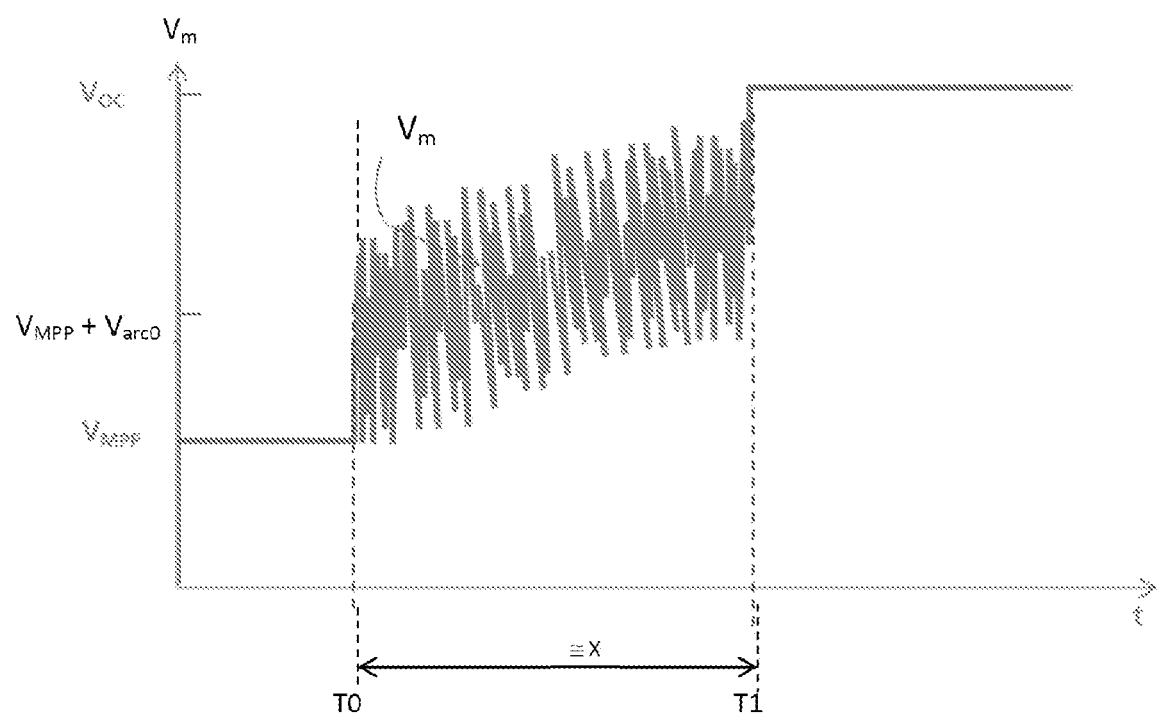
FIG. 3 shows an example of the temporal evolution of the voltage of a photovoltaic module of the photovoltaic installation of FIG. 1 in the presence of an electric arc generated upon opening of an electromagnetic unit of the installation.

The electric arc that occurs upon opening of the switch 3 when live has voltage and current profiles that are characteristic, as shown schematically in FIG. 2. In this FIG. 2, the instants T0 and T1 represent the instants of appearance and of cutoff (or of interruption), respectively, of the electric arc in the switch 3. It is assumed that the photovoltaic modules 1 of the installation 100 are operating at their maximum power point or MPP, characterized by a current $I_{MPP}$ and a voltage $V_{MPP}$. At the instant T0, the voltage across the terminals of the arc changes sharply from a zero or virtually zero value to an arc voltage $V_{arc0}$, and the current produced by the photovoltaic installation 100 changes from a value $I_{MPP}$ to a value $I_{MPP}-I_{arc}$. The voltage and the current remain constant, or substantially constant, and equal to the voltage $V_{arc0}$ and to the current $I_{MPP}-I_{arc}$, respectively, until the instant T1 when the arc is cut off. The arc voltage could increase slightly during the instants T0 and T1 on account of an increase in the resistance of the plasma, leading to an appreciable concomitant decrease in the current I. The duration d between the instants T0 and T1 is less than or equal to a predefined arc-quenching duration X (in this case d is substantially less than X). Then, starting from the instant T1, the voltage of the arc changes back to a zero or virtually zero value and the current of the installation becomes zero (with the switch 3 being open). FIG. 3 shows the evolution over time of the voltage $V_m$ across the terminals of a photovoltaic module 1 when the electric arc occurs upon opening of the disconnecting switch 3. At the instant T0, the voltage $V_m$ changes sharply from the voltage $V_{MPP}$ of the maximum power point of the module 1 to an arc voltage $V_{MPP}+V_{arc0}$, through a first positive voltage edge. At the instant T1, on account of the disappearance of the arc and the opening of the disconnecting switch 3, the voltage $V_m$ changes sharply to the open circuit voltage $V_{OC}$ of the photovoltaic module 1. Between the two instants T0 and T1, the voltage $V_m$ in this case increases slightly on account of the increase in the resistance of the plasma.

There are two main types of stray electric arc, which are linked to faults in the photovoltaic installation 100:
  series electric arcs of long duration, and
  multiple series electric arcs of short durations.

Figure 4:
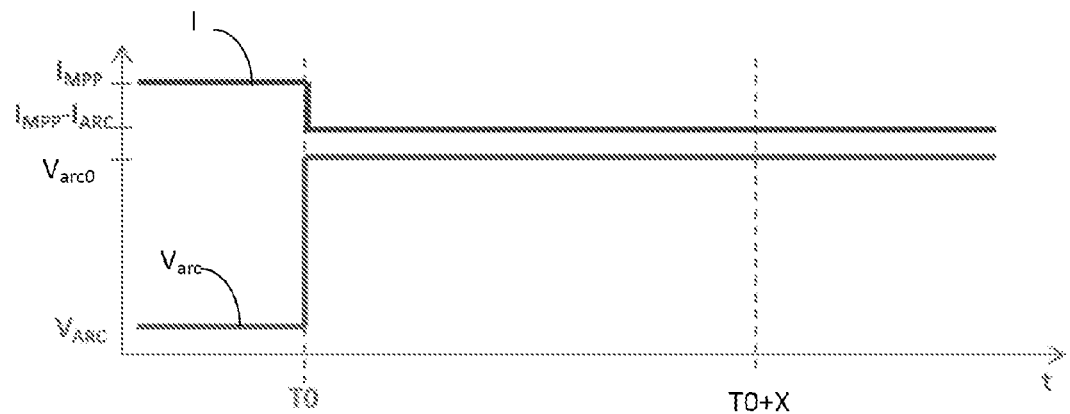
FIG. 4 shows the schematic temporal evolution of the voltage across the terminals of a series electric arc of long duration produced within the photovoltaic installation and the concomitant schematic temporal evolution of the current produced by the photovoltaic installation.
Figure 6:
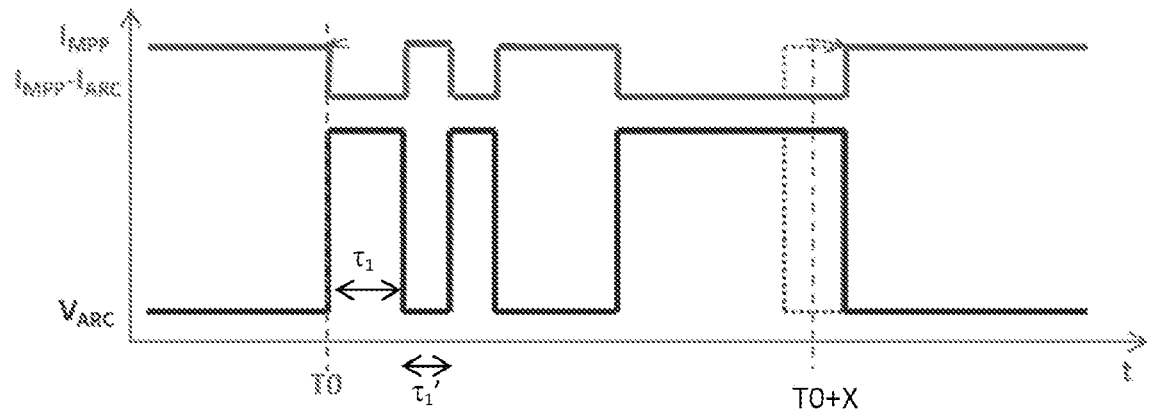
FIG. 6 shows the schematic temporal evolution of the voltage across the terminals of multiple series arcs of short durations produced within the photovoltaic installation and the concomitant schematic temporal evolution of the current produced by the photovoltaic installation.

FIGS. 4 and 6 schematically show the current and voltage profiles of these two types of arc.

Figure 5:
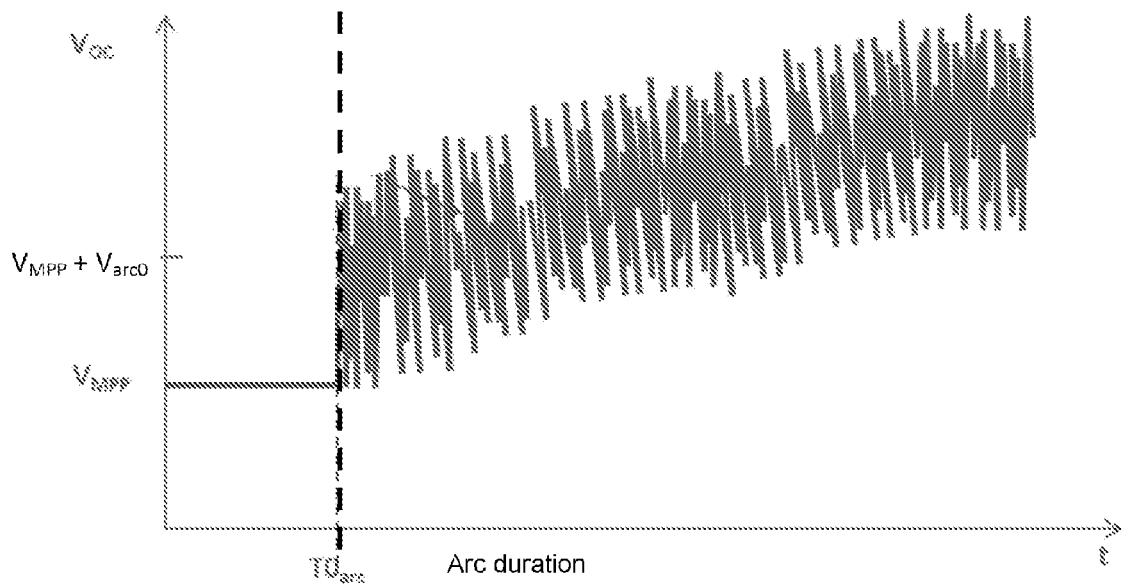
FIG. 5 shows an example of the temporal evolution of the voltage of a photovoltaic module of the installation in the presence of a series electric arc of long duration.

FIG. 4 shows the current and voltage profile of a series electric arc of long duration. At the instant T0 (appearance of the electric arc), the voltage across the terminals of the arc changes sharply from a zero or virtually zero value to an initial arc voltage $V_{arc0}$, and the current I produced by the photovoltaic installation 100 changes from the value $I_{MPP}$ to a value $I_{MPP}-I_{arc}$. The voltage and the current remain constant, or substantially constant, and equal to the voltage $V_{arc0}$ and to the current $I_{MPP}-I_{arc}$, respectively, for a duration that exceeds the arc-quenching duration X of the switch 3. However, the voltage could increase gradually over time, on account of an increase in the resistance of the plasma, and lead to a gradual concomitant reduction in the current I. FIG. 5 shows the evolution over time of the voltage $V_m$ across the terminals of a photovoltaic module 1 when a series electric arc of long duration occurs in the installation 100. At the instant T0, the voltage $V_m$ changes sharply from the voltage $V_{MPP}$ to an arc voltage $V_{MPP}+V_{arc0}$, through a positive voltage edge. The voltage $V_m$ then stagnates or gradually increases slightly, this evolution continuing beyond the duration X starting from the edge.

FIG. 6 shows the current and voltage profile of multiple series electric arcs of short durations. Electric arcs of this type are linked to connection faults (contact oxidation, weld break, unscrewed terminal, etc.). In the presence of such connection faults, electrodes form but remain, through construction, very close to one another, or even in random contact, thereby leading to random electrical connections. An electric arc may appear between these electrodes and last between a few microseconds and a few hundred microseconds. Through melting of the electrode materials, a solder bridge may be created, thus re-establishing electrical contact between the electrodes, and then break again under the Joule effect of the current, thus causing the appearance of a new arc. This process of appearance and disappearance of an arc may be repeated several times and thus generate a succession of electric arcs of short durations that are separated by periods without an arc.

Figure 7:
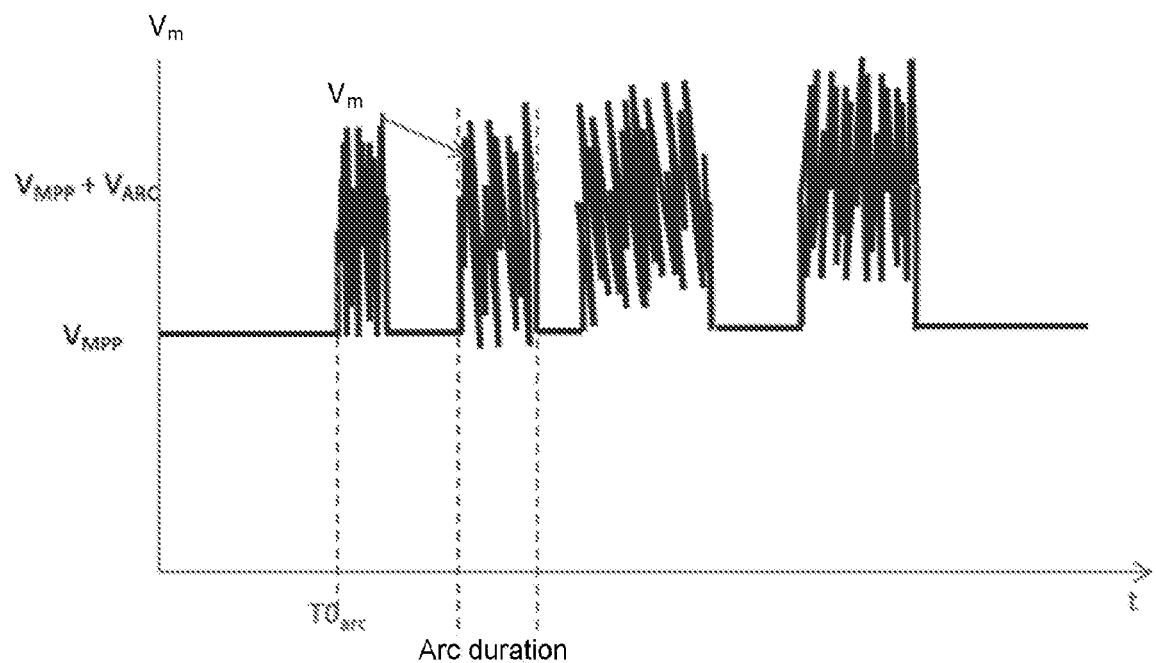
FIG. 7 shows an example of the temporal evolution of the voltage of a photovoltaic module of the installation in the presence of multiple series arcs of short durations.

With reference to FIG. 6, at the instant T0 (appearance of a first electric arc), the voltage across the terminals of the arc changes sharply from a zero or virtually zero value to an arc voltage $V_{arc0}$, and the current produced by the photovoltaic installation 100 changes from a value $I_{MPP}$ to a value $I_{MPP}-I_{arc}$. The voltage and the current remain constant, or substantially constant, and equal to the voltage $V_{arc0}$ and to the current $I_{MPP}-I_{arc}$, respectively, for a short duration (less than the duration X), and then the voltage changes back to a zero or virtually zero voltage and the current changes back to a current $I_{MPP}$ for a duration $\tau_1'$. Such a sequence is repeated several times, one after the other, with variable durations $\tau_1$ and $\tau_1'$. FIG. 7 shows the evolution over time of the voltage $V_m$ across the terminals of a photovoltaic module 1 when series electric arcs of short durations occur: the voltage, initially equal to $V_{MPP}$, changes, for a duration $\tau_1$, to $V_{MPP}+V_{arc0}$, and then changes back to $V_{MPP}$ for a duration $\tau_1'$, this sequence being repeated several times with variable durations $\tau_1$ and $\tau_1'$. Such an accumulation of short electric arc times generates very significant heating that may start a fire.

Figure 9:
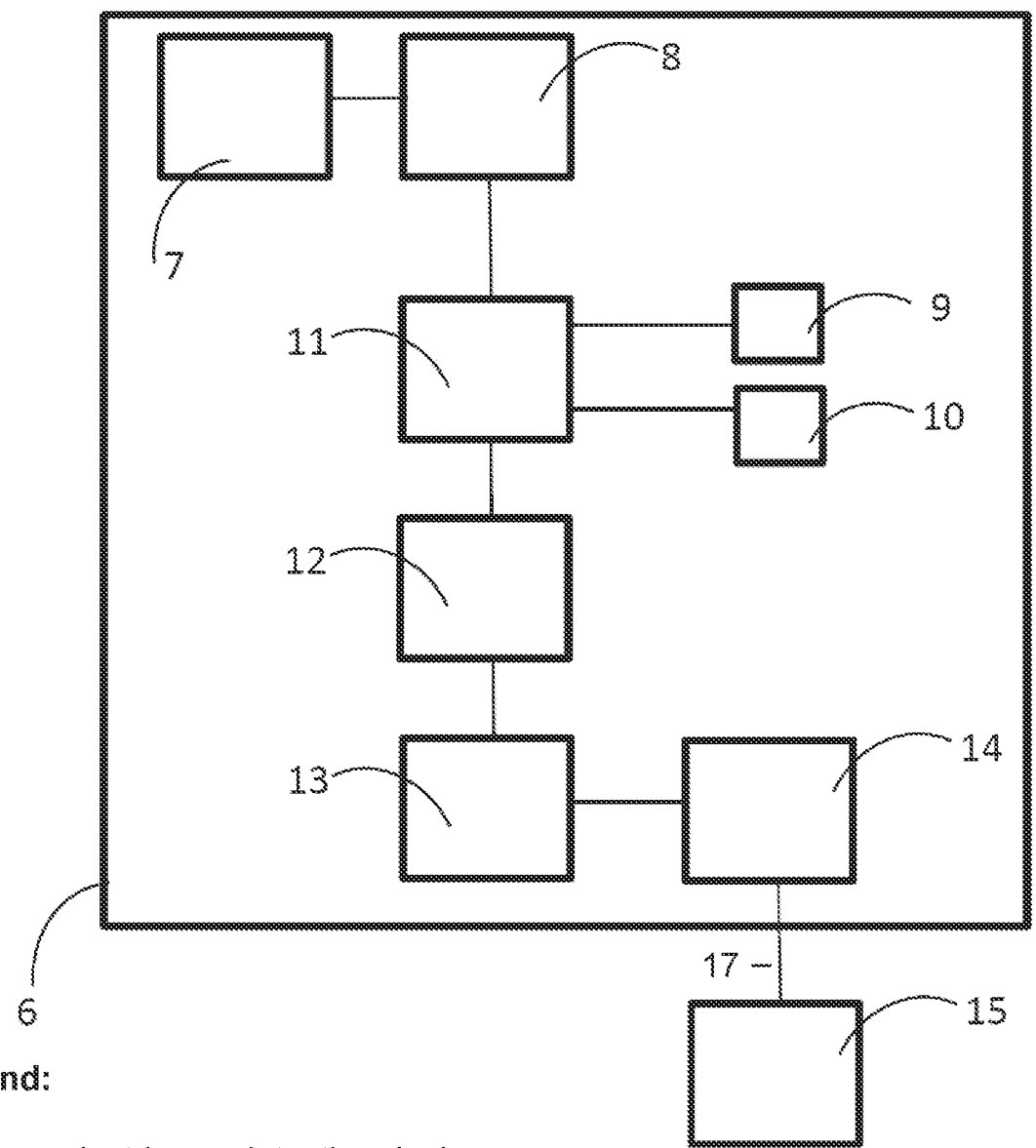
FIG. 9 shows a device for detecting a stray electric arc for a photovoltaic installation, according to one particular form of implementation of the invention, designed to implement the method of FIG. 8.

The photovoltaic installation 100 comprises a stray electric arc detection device 6. With reference to FIG. 9, the detection device 6 in this case comprises:

- a module 7 for detecting the appearance of an electric arc in the photovoltaic installation;
- a timer 8 intended to time a lapsed duration starting from the instant of appearance of the electric arc;
- one or more sensors 9 for measuring the voltage across the terminals of one or more photovoltaic modules 1 of the photovoltaic installation 100;
- a sensor 10 for measuring the current produced by the photovoltaic installation 100;
- a control module 11 intended to control measurements of voltage and current by the sensors 9 and 10;
- a test module 12 intended to carry out a test of comparing the measured voltage with an open circuit voltage $V_{OC}$ of the photovoltaic module 1 and a test of comparing the measured current with a zero current;
- a module 13 for identifying the detected electric arc, intended to determine whether a stray electric arc or an electric arc linked to the opening of the switch 3 when live is involved;
- storage memories (not shown);
- a processing unit 14, in this case a microprocessor.

The modules 7, 8, 11, 12 and 13 are in this case software components that are intended to be executed by the processing unit 14. The hardware and/or software components of the processing unit 14 are designed to implement the method that is described further on.

The module 7 for detecting the appearance of an electric arc is designed to implement a known electric arc detection method that is capable of quickly detecting the appearance of an electric arc, preferably within a maximum period of a few hundred microseconds after this appearance. The detection method may be based on the detection of a voltage jump, as described for example in patent document FR3002645, or on the detection of a current jump, as described in the French patent application filed under number 1561622. The detection module 7 is linked to one or more voltage or current measurement sensors, depending on the method that is implemented, by communication links. It may be linked to the sensors 9 or to the sensor 10, for example.

The timer 8 is intended to measure the lapsed duration from an instant T0 of appearance of an electric arc detected by the module 7.

The control module 11 is intended to control measurements of voltage and of current by the sensors 9 and 10 at the end of a lapsed duration starting from the instant T0 of appearance of the detected electric arc, which duration is greater than or equal to a known arc-quenching duration X, which is typically of the order of 10 ms or a few tens of milliseconds.

The test module 12 is intended to execute two tests in this case, one (voltage test) on the voltage measured by the sensor 9, the other (current test) on the current measured by the sensor 10. If a plurality of sensors 9 measure the voltages across the terminals of a plurality of photovoltaic modules 1, the test module executes a voltage test for each measured voltage. The voltage test consists in comparing the measured voltage of the photovoltaic module with the open circuit voltage $V_{OC}$ of this module in order to determine whether the measured voltage is equal to $V_{OC}$. The current test consists in determining whether the measured current of the photovoltaic installation is zero. The test module could carry out just one of the two types of test (current or voltage).

The identification module 13 is intended to identify the nature, 'stray' or 'non-stray', of the detected electric arc, in other words to determine whether the detected electric arc is a stray electric arc (a priori linked to a fault) or a non-stray electric arc (linked a priori to the opening of the switch 3 when live), on the basis of the results of voltage and/or current tests.

All of the elements of the detection device 6 are linked to the processing unit 14, which is designed to control the operation thereof. The processing unit 14 is intended to execute the various software modules of the device 6. Its role is also to transmit a protection order to an intervention device 15 if a stray electric arc is detected.

The detection device 6 is linked to the intervention device 15 by a communication link 17. The role of the intervention device 15 is to interrupt a stray electric arc detected by the detection device 6, upon the order of the latter, in order to prevent any risk of damage or of fire.

The stray electric arc detection device 6 and the intervention device 15 form a safety system for the photovoltaic installation 100.

Figure 8:
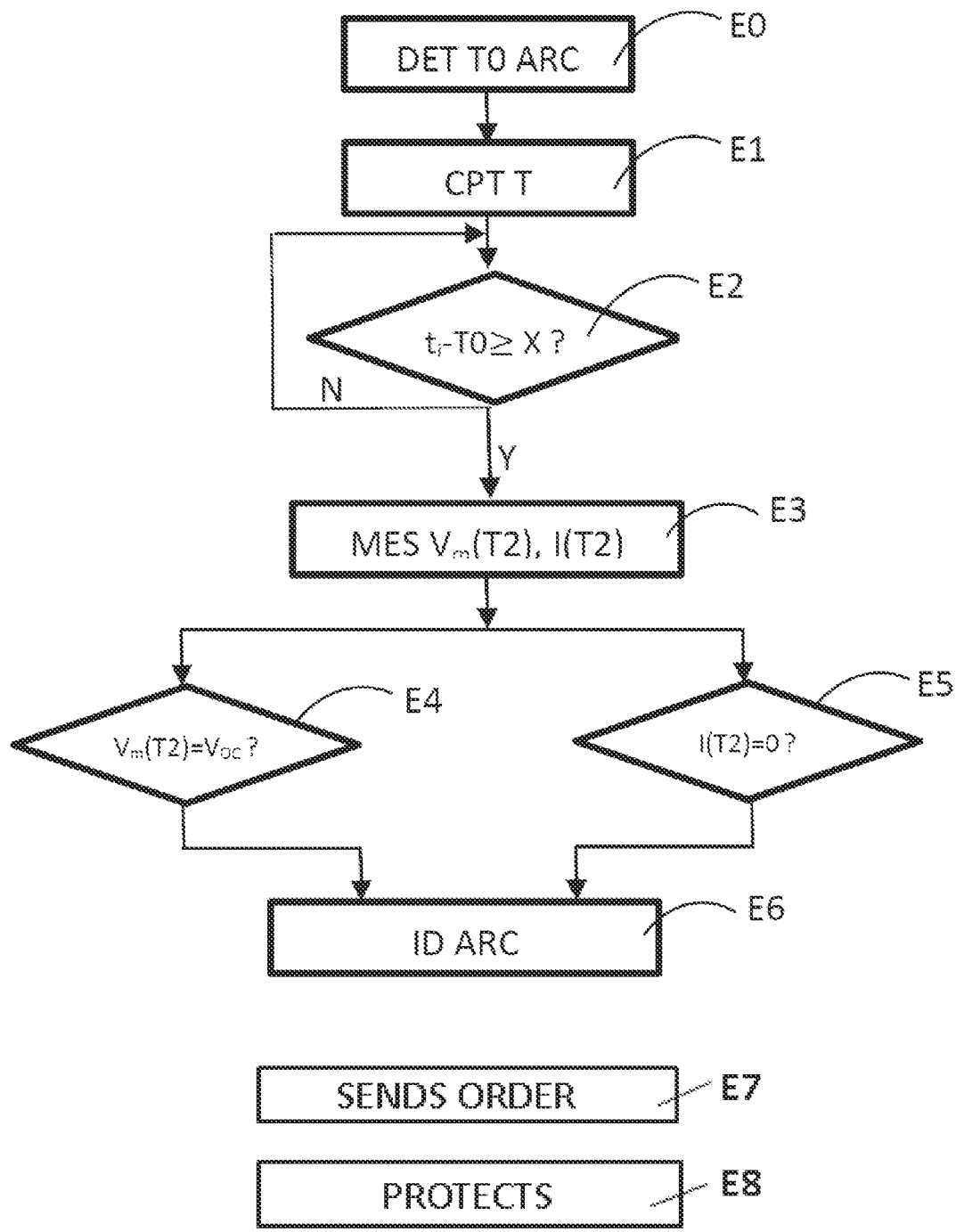
FIG. 8 shows a flow chart of the steps of the method for detecting a stray electric arc, according to one particular embodiment of the invention.

With reference to FIG. 8, a description will now be given of a method for detecting a stray electric arc in the photovoltaic installation 100.

The method comprises a first step E0 of detecting the appearance of an electric arc in the photovoltaic installation, carried out by the detection module 7. This detection step may be implemented by executing any known method for detecting an electric arc, designed to detect the arc quickly, preferably within a maximum period of a few hundred microseconds after it appears. For example, the detection of the electric arc is carried out in accordance with the detection method described in patent document FR3002645. As a variant, the appearance of an electric arc could be detected by executing an algorithm for detecting a current jump characteristic of the appearance of an electric arc, as described in the French patent application filed under number 1561622.

The instant of appearance of the electric arc is denoted T0. This instant T0 is detected in step E0.

At the instant T0, in a step E1, the timer 8 is triggered in order to measure the time starting from the appearance of the detected electric arc.

The control module 11 then executes a test step E2 at a succession of instants $t_i$ following T0, in order to check whether the duration between T0 and $t_i$ is greater than or equal to the arc-quenching duration X. Step E2 is reiterated for successive instants $t_i$ for as long as the test is negative. If the test is positive at an instant $t_i$=T2, with the duration between the instants T0 and T2 being greater than or equal to the arc-quenching duration X, the method moves to a measurement step E3.

In step E3, upon the order of the control module 11, the sensors 9 and 10 measure the voltage $V_m$(T2) across the terminals of at least one photovoltaic module 1 of the installation 100 and the current I(T2) produced by the installation 100 at the instant T2. As a variant, the voltage $V_m$ and the current I may be measured slightly after this instant T2.

The method continues with two test steps E4 and E5, carried out by the test module 12.

In the test step E4, the module 12 carries out a test of comparing the measured voltage $V_m$(T2) with the open circuit voltage $V_{OC}$ of the photovoltaic module 1. This voltage test consists in determining whether the measured voltage $V_m$(T2) is equal to the open circuit voltage $V_{OC}$. If the voltages across the terminals of a plurality of photovoltaic modules 1 are measured, the voltage test is executed for each of the measured voltages. The test is positive if the measured voltage $V_m(T2)$ is equal to the open circuit voltage $V_{OC}$, and negative if not. It is possible to accept a certain margin of accuracy and consider that the test E4 is positive if $V_m(T2)$ is equal to the open circuit voltage $V_{OC}+$ or $-10\%$ of $V_{OC}$.

In the test step E5, the module 12 carries out a test of comparing the measured current I(T2) with a zero current. This current test consists in determining whether the current I(T2) is zero, the test being positive if the current I(T2) is zero, and negative if not. It is possible to accept a certain margin of accuracy and consider that the test is positive if the current I(T2) is less than 10% of $I_{MPP}$ (current of the maximum power point).

The two tests E4 and E5 are followed by a step E6, carried out by the module 13, of identifying the detected electric arc, consisting in determining whether a stray arc (linked to a fault) or a non-stray arc (linked to the opening of the switch 3 when live) is involved. If at least one of the two tests is negative, in other words if the measured voltage $V_m(T2)$ is different from the voltage $V_{OC}$ (possibly to within 10%) and/or if the measured current I(T2) is not zero (or possibly substantially zero, less than 10% of $I_{MPP}$), it is determined that the detected electric arc is a stray arc. If the two tests are positive, in other words if the measured voltage $V_m(T2)$ is equal to the voltage $V_{OC}$ and if the measured current I(T2) is zero, it is determined that the detected electric arc is a non-stray arc, linked in this case to the opening of the switch 3 when live.

When a stray electric arc is detected, the processing unit 14 automatically sends an order to the intervention device 15 to protect the installation 100, in a step E7. In a step E8, the intervention device 15 protects the photovoltaic installation 100. This protection may be based on remotely controlled switches. It may consist of an order to interrupt the operation of the photovoltaic installation, thereby making it possible to stop the stray electric arc and to eliminate any risk of damage and/or of starting a fire.

In the embodiment of the method described above, the voltage across the terminals of at least one photovoltaic module 1 and the current produced by the photovoltaic installation 100 at the instant T2 are measured. As a variant, it is possible to measure just one of these two electrical values, for example either the voltage $V_m(T2)$ or the current I(T2), to test only the measured value (with the voltage $V_{OC}$ for the measured voltage $V_m(T2)$, and with a zero current for the measured current I(T2)), and to determine whether the detected electric arc is a stray or non-stray arc depending on whether the test is negative or positive, respectively.

The electric arc detection method that has just been described makes it possible to differentiate between an electric arc generated by a disconnecting switch of a photovoltaic installation, upon opening of the contacts of the switch, and an electric arc linked to a fault. More generally, the method of the invention makes it possible to differentiate between an electric arc generated by an electromechanical unit liable to generate an electric arc upon opening and/or upon closure of contacts of the unit when live and an electric arc linked to a fault. The electromechanical unit may be for example a switch, a contactor or else a circuit breaker.

The invention claimed is:

1. A method for detecting a stray electric arc in a photovoltaic installation including at least one photovoltaic module and an electromechanical unit liable to generate a non-stray electric arc of a duration less than or equal to a given arc-quenching duration, upon opening of contacts of the electromechanical unit, the method comprising:
   detecting the appearance of an electric arc in the photovoltaic installation;
   triggering a timer starting from an instant of appearance of the electric arc;
   after expiry of the arc-quenching duration starting from the instant of appearance of the electric arc, measuring at least one of electrical values from a group including a voltage of the at least one photovoltaic module and a current produced by the photovoltaic installation;
   performing a comparison test in order to determine whether the measured electrical value is equal to an open circuit voltage of the photovoltaic module or to a zero current;
   if the comparison test is negative, identifying a stray electric arc.

2. The method as claimed in claim 1, wherein, in the measuring, upon expiry of the arc-quenching duration, the voltage of the at least one photovoltaic module and the current produced by the photovoltaic installation are measured, wherein the comparison test comprises a first comparison test in order to determine whether the measured voltage is equal to the open circuit voltage of the at least one photovoltaic module and a second comparison test in order to determine whether the measured current is zero, and wherein it is determined that the detected electric arc is a stray arc if at least one of the first and second comparison tests is negative.

3. The method as claimed in claim 2, wherein the appearance of an electric arc is detected by executing an algorithm for detecting a voltage jump characteristic of the appearance of an electric arc.

4. The method as claimed in claim 2, wherein the appearance of an electric arc is detected by executing an algorithm for detecting a current jump characteristic of the appearance of an electric arc.

5. The method as claimed in claim 1, wherein the appearance of an electric arc is detected by executing an algorithm for detecting a voltage jump characteristic of the appearance of an electric arc.

6. The method as claimed in claim 5, wherein the appearance of an electric arc is detected by executing an algorithm for detecting a current jump characteristic of the appearance of an electric arc.

7. The method as claimed in claim 1, wherein the appearance of an electric arc is detected by executing an algorithm for detecting a current jump characteristic of the appearance of an electric arc.

8. A device for detecting a stray electric arc, intended to be fitted in a photovoltaic installation including at least one photovoltaic module and an electromechanical unit liable to generate a non-stray electric arc of a duration less than or equal to a given arc-quenching duration, upon opening of contacts of the electromechanical unit when live, the device comprising:
   a module for detecting the appearance of an electric arc in the photovoltaic installation;
   a timer configured to time a lapsed duration starting from the instant of appearance of the electric arc;
   a sensor for measuring at least one of electrical values from a group including a voltage across the terminals of the photovoltaic module and a current produced by the photovoltaic installation, configured to perform a measurement after expiry of the arc-quenching duration starting from the instant of appearance of the arc;

a test module configured to carry out a comparison test in order to determine whether the measured electrical value is equal to an open circuit voltage of the at least one photovoltaic module or to a zero current;

a module for identifying the detected electric arc, configured to determine that the detected electric arc is a stray arc if the test module supplies a negative test result.

9. The device as claimed in claim 8, comprising at least one sensor for measuring the voltage of the at least one photovoltaic module and a sensor for measuring the current produced by the photovoltaic installation, wherein the test module is configured to carry out a first comparison test of comparing the measured voltage with the open circuit voltage of the at least one photovoltaic module and a second comparison test of comparing the measured current with the zero current, and wherein the module for identifying the detected electric arc is configured to determine that the detected electric arc is a stray arc if the test module supplies a negative test result for at least one of the two comparison tests that are carried out.

10. The device as claimed in claim 9, comprising the module for detecting the appearance of an electric arc by executing an algorithm for detecting a voltage jump characteristic of the appearance of an electric arc.

11. The device as claimed in claim 9, comprising the module for detecting the appearance of an electric arc by executing an algorithm for detecting a current jump characteristic of the appearance of an electric arc.

12. A photovoltaic installation, comprising the device for detecting a stray electric arc as claimed in claim 9.

13. A safety system for a photovoltaic installation, the safety system comprising the device for detecting a stray electric arc as claimed in claim 9 and an intervention device configured to protect the photovoltaic installation in the event of an electric arc.

14. The device as claimed in claim 8, comprising the module for detecting the appearance of an electric arc by executing an algorithm for detecting a voltage jump characteristic of the appearance of an electric arc.

15. A photovoltaic installation, comprising the device for detecting a stray electric arc as claimed in claim 14.

16. A safety system for a photovoltaic installation, the safety system comprising the device for detecting a stray electric arc as claimed in claim 14 and an intervention device configured to protect the photovoltaic installation in the event of an electric arc.

17. The device as claimed in claim 8, comprising the module for detecting the appearance of an electric arc by executing an algorithm for detecting a current jump characteristic of the appearance of an electric arc.

18. A photovoltaic installation, comprising the device for detecting a stray electric arc as claimed in claim 8.

19. A safety system for a photovoltaic installation, the safety system comprising the device for detecting a stray electric arc as claimed in claim 8 and an intervention device configured to protect the photovoltaic installation in the event of an electric arc.

20. A photovoltaic installation, comprising the safety system as claimed in claim 19.

* * * * *